United States Patent
Li et al.

(10) Patent No.: US 12,033,919 B2
(45) Date of Patent: Jul. 9, 2024

(54) BACKSIDE OR FRONTSIDE THROUGH SUBSTRATE VIA (TSV) LANDING ON METAL

(71) Applicant: Taiwan Semiconductor Manufacturing Co., Ltd., Hsin-Chu (TW)

(72) Inventors: Zheng-Xun Li, Tainan (TW); Min-Feng Kao, Chiayi (TW); Hsing-Chih Lin, Tainan (TW); Jen-Cheng Liu, Hsin-Chu (TW); Dun-Nian Yaung, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 35 days.

(21) Appl. No.: 17/144,717

(22) Filed: Jan. 8, 2021

(65) Prior Publication Data

US 2022/0223498 A1 Jul. 14, 2022

(51) Int. Cl.
*H01L 23/48* (2006.01)
*H01L 21/768* (2006.01)

(52) U.S. Cl.
CPC ...... *H01L 23/481* (2013.01); *H01L 21/76802* (2013.01); *H01L 21/76877* (2013.01); *H01L 21/76898* (2013.01)

(58) Field of Classification Search
CPC ............ H01L 23/481; H01L 21/76802; H01L 21/76877; H01L 21/76898; H01L 23/5226
See application file for complete search history.

(56) References Cited

U.S. PATENT DOCUMENTS

| | | | |
|---|---|---|---|
| 9,525,001 B2* | 12/2016 | Cheng | H01L 24/80 |
| 9,941,249 B2* | 4/2018 | Tsai | H01L 23/528 |
| 10,199,326 B1* | 2/2019 | Ohsaki | H01L 27/11553 |
| 2015/0097258 A1 | 4/2015 | Shigetoshi | |
| 2015/0235922 A1* | 8/2015 | Chen | H01L 23/53295 257/383 |
| 2015/0348874 A1* | 12/2015 | Tsai | H01L 21/76898 257/774 |
| 2015/0380385 A1* | 12/2015 | Hsu | H01L 21/76801 438/459 |
| 2016/0020170 A1* | 1/2016 | Ho | H01L 24/02 257/774 |
| 2016/0049384 A1* | 2/2016 | Lu | H01L 21/8221 257/737 |

(Continued)

FOREIGN PATENT DOCUMENTS

JP 2016048743 A 4/2016

*Primary Examiner* — Bac H Au
(74) *Attorney, Agent, or Firm* — Eschweiler & Potashnik, LLC

(57) ABSTRACT

Some embodiments relate to a semiconductor structure including a semiconductor substrate, and n interconnect structure disposed over the semiconductor substrate. The interconnect structure includes a dielectric structure and a plurality of metal lines that are stacked over one another in the dielectric structure. A through substrate via (TSV) extends through the semiconductor substrate to contact a metal line of the plurality of metal lines. A protective sleeve is disposed along outer sidewalls of the TSV and separates the outer sidewalls of the TSV from the dielectric structure of the interconnect structure.

20 Claims, 13 Drawing Sheets

(56) References Cited

U.S. PATENT DOCUMENTS

| | | | |
|---|---|---|---|
| 2016/0056129 A1* | 2/2016 | Horibe | H01L 21/308 |
| | | | 438/109 |
| 2016/0315047 A1 | 10/2016 | Uzoh et al. | |
| 2017/0005000 A1* | 1/2017 | Beyne | H01L 21/76844 |
| | | | 257/737 |
| 2017/0301577 A1 | 10/2017 | Sanders et al. | |
| 2019/0371727 A1* | 12/2019 | Kuwabara | H01L 28/10 |
| 2020/0006128 A1 | 1/2020 | Weng et al. | |
| 2020/0176380 A1* | 6/2020 | Chen | H01L 23/5226 |
| 2020/0185407 A1* | 6/2020 | Xiao | H01L 27/11573 |
| 2022/0084940 A1* | 3/2022 | Chen | H01L 23/481 |

* cited by examiner

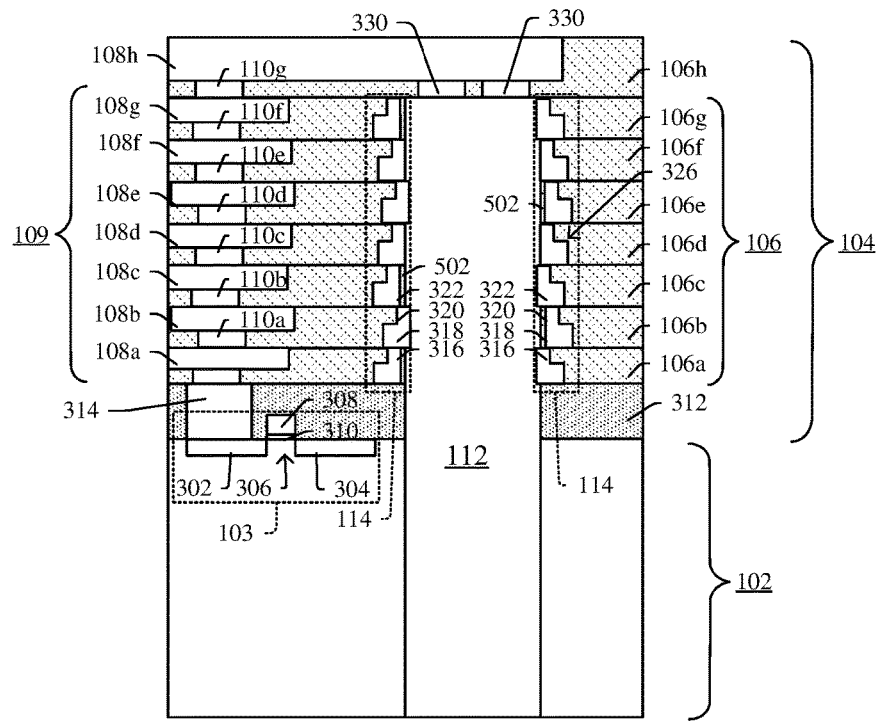
Fig. 5A
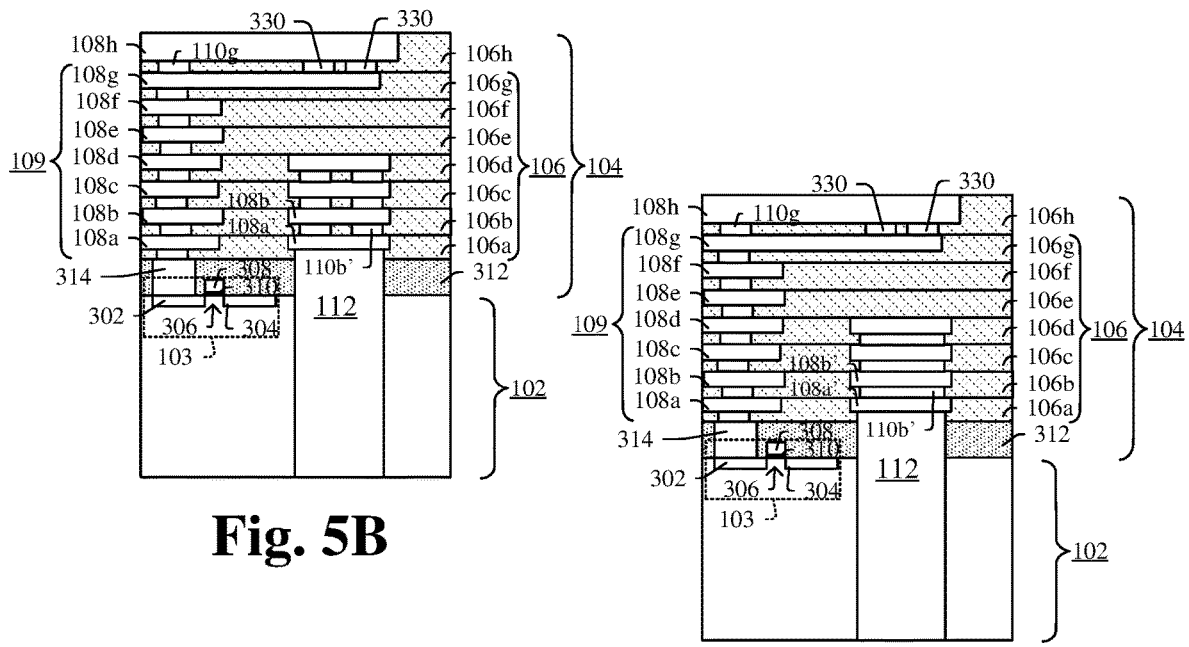
Fig. 5B
Fig. 5C

BACKSIDE OR FRONTSIDE THROUGH SUBSTRATE VIA (TSV) LANDING ON METAL

BACKGROUND

Modern day integrated chips contain billions or trillions of semiconductor devices. The semiconductor devices are electrically interconnected by way of back-end-of-the-line metal interconnect layers that are formed above the devices on an integrated chip. A typical integrated chip comprises a plurality of back-end-of-the-line metal interconnect layers embedded within dielectric material. The metal interconnect layers contain corresponding layers of metal wires that are coupled vertically together with metal vias. The size of the metal interconnect layers increases from thin metal lines that connect to the devices, to thick metal lines that connect to off chip components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A illustrates a cross-sectional view of some embodiments of a semiconductor structure including a TSV and a protective sleeve separating sidewalls of the TSV from adjacent dielectric layers.

FIG. 5B illustrates a cross-sectional view of some alternative embodiments of a semiconductor structure including a TSV.

FIG. 5C illustrates a cross-sectional view of some alternative embodiments of a semiconductor structure including a TSV.

DETAILED DESCRIPTION

Figure 1:
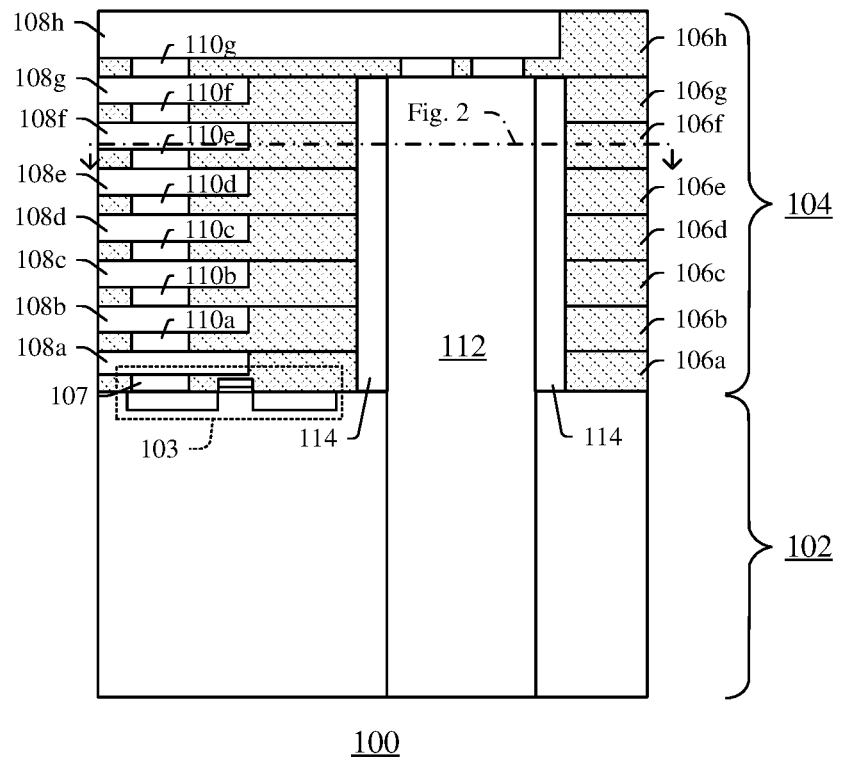
FIG. 1 illustrates a cross-sectional view of some embodiments of a semiconductor structure including a through substrate via (TSV) and a protective sleeve separating sidewalls of the TSV from adjacent dielectric layers.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Modern day integrated chips include one or more semiconductor substrates in which billions or trillions of semiconductor devices are disposed. When a chip includes multiple substrates stacked over one another, each substrate can include a corresponding interconnect structure, wherein the semiconductor devices of a given substrate are electrically interconnected by way of back-end-of-the-line (BEOL) metal lines that are formed in the interconnect structure corresponding to that substrate. For example, a typical interconnect structure comprises a plurality of BEOL metal interconnect layers embedded within dielectric material. The metal interconnect layers contain corresponding layers of metal wires that are coupled vertically together with metal vias. The size of the metal interconnect layers for a given substrate increases from thin metal wires nearer to the substrate, to thick metal wires further away from the substrate. Typically, the layers of metal wires are referred to by numbers that are incremented as one moves further from the substrate—so for example, the layer of metal wires closest to the substrate can be referred to a metal0 layer, the next layer of wires can be referred to as a metal 1 layer, then a metal 2 layer, and so on.

Because modern day integrated chips can include multiple substrates, in some instances it is advantageous to provide an electrical connection that passes through a substrate, thereby enabling additional pathways for connections of the devices on different substrates to one another. This is accomplished by using a through-substrate-via (TSV) made of conductive material that extends from a first side of the substrate and passes through the entirety of the substrate and out the second side of the substrate to land on a thin BEOL metal line (e.g., M0 line) nearest the second side of the substrate. Some aspects of the present disclosure lie in the appreciation that if such a TSV were to land on a thicker, higher layer of metal wires (rather than a lower, thinner layer of metal wires), the overall contact resistance could be reduced in some advanced technologies. This could help reduce resistive-capacitive (RC) coupling, and thereby improve overall performance of the integrated chip.

However, the dielectric material in which such layers of metal lines are embedded are typically high-k dielectric materials that are quite porous, and accordingly quite fragile. As such, the present disclosure contemplates that, absent countermeasures, the aggressive nature of the etching process used to provide an opening to form a TSV to a higher layer of metal wires would damage the high-k dielectric material surrounding the TSV and lead to reliability issues. Accordingly, the present disclosure provides a protective sleeve to separate outer sidewalls of the TSV from the low-k dielectric. The protective sleeve is formed prior to the TSV, and thus, when an etch is performed to etch through the substrate and portions of the interconnect to form an opening in which the TSV will be formed, the etch is confined within the protective sleeve to protect the surrounding low-k dielectric. In this way, the final integrated chip can provide a TSV that extends through a substrate, past lower thinner layers of metal wires, and to a higher, thicker layer of metal wires in a manner that protects adjacent dielectric layers, thereby providing a reliable connection with low RC coupling and good performance.

Figure 2:
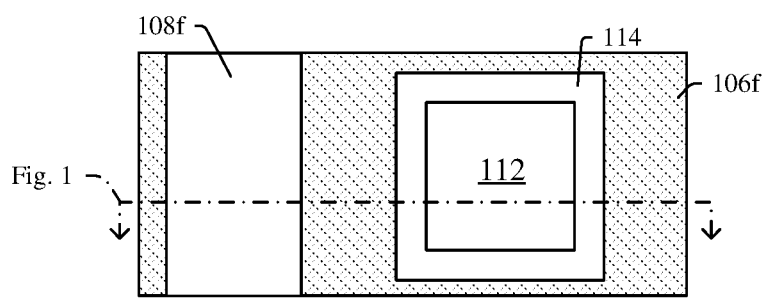
FIG. 2 illustrates a top view of a semiconductor structure consistent with some embodiments of FIG. 1.

FIG. 1 illustrates a cross-sectional view and FIG. 2 illustrates a corresponding top view of a semiconductor structure 100 in accordance with some embodiments, and are now discussed concurrently. The semiconductor structure 100 includes a semiconductor substrate 102 with one or more devices (e.g., transistor 103) embedded therein, and an interconnect structure 104 disposed over the semiconductor substrate 102. The interconnect structure 104 includes a dielectric structure made up of multiple dielectric layers 106a-106h that can be made of a low-k dielectric material, and a plurality of metal lines 108a-108h and vias 110a-110g that are stacked over one another in the respective dielectric layers 106a-106h. A through substrate via (TSV) 112, which can comprise a metal such as copper or aluminum for example, extends through the semiconductor substrate 102 and through at least a portion of the interconnect structure 104 to contact an upper metal line 108h of the plurality of metal lines. A protective sleeve 114 is disposed along outer sidewalls of the TSV 112 and laterally surrounds the TSV 112 to separate the outer walls of the TSV 112 from the dielectric layers 106a-106g of the interconnect structure 104. By separating the outer sidewalls of the TSV 112 from the dielectric layers 106a-106g, the protective sleeve 114 provides advantages during manufacturing that result in better device performance and reliability for the final semiconductor structure 100. In particular, during manufacturing, the protective sleeve 114 is in place when an etch is performed to form an opening for the TSV 112 (wherein the opening extends through the substrate and through the dielectric layers), such that the protective sleeve 114 confines the etch to protect the surrounding dielectric layers 106a-106g, which could otherwise be damaged from the etch. Thus, when a metal is subsequently used to fill the opening to establish the TSV 112, the TSV 112 passes through the dielectric layers 106a-106h which are un-damaged by the etch, thereby providing a reliable connection to the upper metal line 108h with low RC coupling and good performance.

It will be appreciated that FIGS. 1-2 depict the semiconductor structure 100 in somewhat simplified fashion, and any number of variations are contemplated as falling within the scope of the disclosure some of which will be illustrated and described further below. For example, for purposes of understanding, features such as etch stop layers and/or other dielectric layers may be omitted from the semiconductor structure 100 of FIGS. 1-2, but such features may be present in other embodiments. Further, while in some cases the dielectric layers 106a-106h are made of low-k dielectric material, in other embodiments one or more of these dielectric layers 106a-106h can be made of other dielectric materials, such as silicon dioxide, silicon nitride, and/or silicon oxynitride, among others. Similarly, while the interconnect structure 104 is described above as including metal lines 108a-108h, which can manifest as copper, aluminum, tungsten, and/or nickel, among other metals, in some embodiments one or more layers of these metal lines could alternatively be made of another conductive material, such as doped polysilicon for example. In addition, though FIG. 1 shows seven layers of metal lines 108a-108h, a layer of contacts 107, and seven layers of vias 110a-110g; in general, any number of metal layers, contacts, and vias may be present, and thus FIG. 1 is just an example. The protective sleeve 114 often comprises the same material as the metal lines 108a-108h and vias 110a-110g, which allows for streamlined manufacturing techniques to be used, but can also comprise a different metal from the metal lines and/or vias in other embodiments. The protective sleeve 114 could alternatively comprise dielectric material, such as a nitride or silicon dioxide that offers increased structural integrity compared to the dielectric material (e.g., low-k dielectric) of the dielectric layers 106a-106g. Further, though FIG. 1 illustrates the protective sleeve 114 as extending continuously over the entire height of the TSV 112 above the substrate 102 (e.g., extending continuously from the upper surface of the substrate 102 to the upper surface of metal layer 108g); in other embodiments, the protective sleeve 114 may only partially cover sidewalls of the TSV 112 above the substrate 112. For example, in some cases a lowermost sidewall portion of the TSV 112 above the substrate 102 and/or an uppermost sidewall portion of the TSV 112 above the substrate 102 can be left uncovered by the protective sleeve 114. Also, rather than extending continuously over the entire height of the TSV 112 above the substrate 102, the protective sleeve 114 may have breaks or seams, for example, corresponding to an etch stop layer between the adjacent dielectric layers. Several additional embodiments are illustrated and described below referencing FIGS. 3-5, but again, it will be appreciated that these are merely non-limiting examples.

Figure 3:
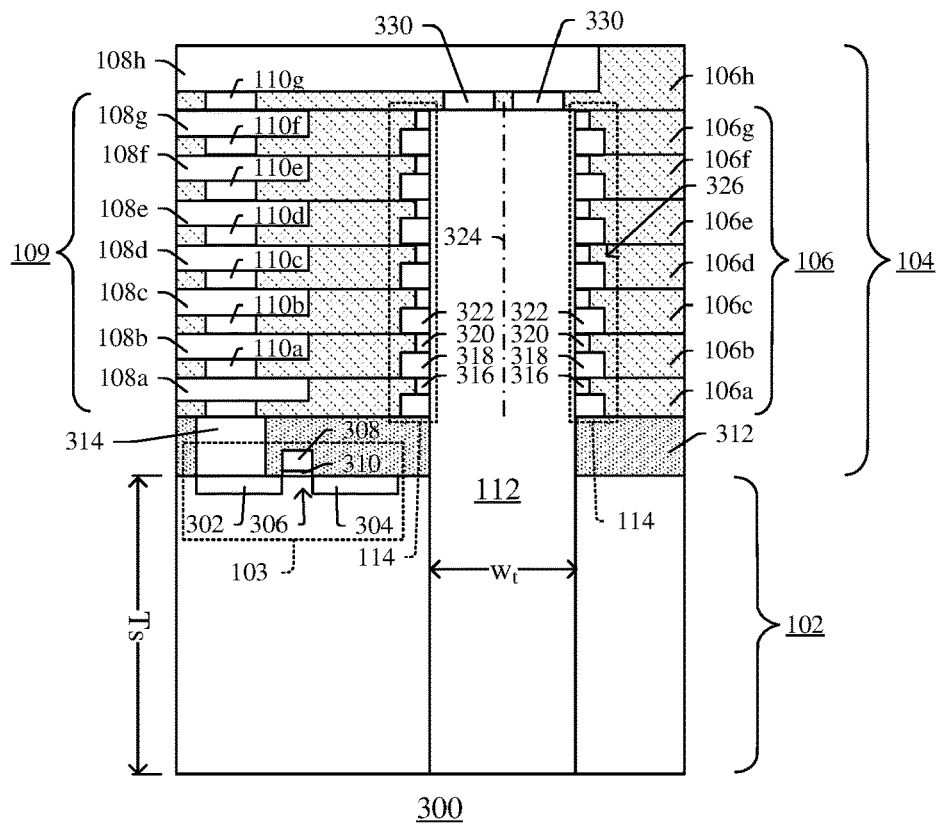
FIG. 3 illustrates a cross-sectional view of some embodiments of a semiconductor structure including a through substrate via (TSV) and a protective sleeve separating sidewalls of the TSV from adjacent dielectric layers.

Referring now to FIG. 3, one can see some embodiments of a semiconductor structure 300 wherein the protective sleeve 114 is implemented as a series of ring segments that are disposed as metal layers and via layers of the interconnect structure 104. FIG. 3's semiconductor structure 300 may comprise some aspects the semiconductor structure 100 in FIGS. 1-2 (and vice versa); and thus, in some embodiments the features explained above with regards to FIGS. 1-2 are also applicable to the semiconductor structure 300 in FIG. 3 (and vice versa). Accordingly, some reference numerals are the same in FIGS. 1-2 and FIG. 3, and these corresponding features may be the same for these figures or may have small deviations there between.

In FIG. 3's example, the semiconductor substrate 102 can be a monocrystalline silicon substrate or a semiconductor-on-insulator (SOI) substrate (e.g., silicon on insulator substrate). The semiconductor substrate 102 can include doped regions formed in or on the semiconductor substrate 102, epitaxial layers formed in or on the semiconductor substrate 102, insulating layers formed in or on the semiconductor substrate 102, photoresist layers formed in or on the semiconductor substrate 102, and/or conducting layers formed in or on the semiconductor substrate 102. In some embodiments, the semiconductor substrate 102 has a thickness, Ts, ranging from 5 microns to 50 microns, and which is approximately 9 microns in some examples.

A transistor device 103 is disposed in or over the semiconductor substrate 102. The transistor device 103 includes a first source/drain region 302 and a second source/drain region 304 that share a first conductivity type (e.g., n-type semiconductor material), and which are spaced apart by a channel region 306 having a second conductivity type (e.g., p-type semiconductor material). A gate electrode 308 is arranged over the channel region 306, and is separated from the channel region 306 by a gate dielectric 310. Thus, the first source/drain region 302, the second source/drain region 304, and the gate electrode 308 are each an example of a conductive device feature. However, it will be appreciated that a "conductive device feature" is not limited to these structures and can take a myriad of forms, including a terminal of an active device such as a FinFET, MOSFET, or BJT for example; and/or a terminal of a passive device such as a diode, resistor, capacitor, and/or memory element; and/or an contact, via, or metal line; among others.

A base dielectric layer 312 is disposed over the semiconductor substrate 102 and comprises a first dielectric material with a first dielectric constant. In some embodiments, the first dielectric material comprises silicon dioxide, and the first dielectric constant is about 3.9. In other embodiments, the first dielectric material comprises a low-k dielectric material or another dielectric.

A lower metal feature 314, such as a contact or a metal0 line, extends through the base dielectric layer 312 and contacts a conductive feature in or on the substrate (e.g., the first source/drain region 302). The lower metal feature 314 can comprise a metal, such as tungsten, aluminum, nickel, and/or copper, for example. In some embodiments, the lower metal feature 314 manifests as a contact in the shape of a pillar that extends vertically between the first source/drain 302 and a lower metal line 108a and/or a lower via, while in other cases the lower metal feature 314 is a metal0 line that extends over the upper surface of the substrate 102 to couple adjacent source/drains or other conductive features to one another.

One or more intermediate dielectric layers 106 (e.g., dielectric layers 106a-106g) are disposed over the base dielectric layer 312. In some embodiments, these one or more intermediate dielectric layers 106 have a second dielectric constant that is less than the first dielectric constant. Thus, the one or more intermediate dielectric layers 106 can comprise a low-k dielectric material having a dielectric constant that is less than 3.9.

One or more intermediate metal features 109 (e.g., intermediate metal layers 108a-108g and via layers 110a-110f) extend through the one or more intermediate dielectric layers 106, respectively, and are coupled to the lower metal feature 314. The one or more intermediate metal features 109 typically comprise a metal, such as copper and/or aluminum for example, but can also comprise other conductive materials, such as doped polysilicon for example.

An upper dielectric layer 106h is disposed over the one or more intermediate dielectric layers 106. The upper dielectric layer 106h can comprise a low-k dielectric material, and can have a dielectric constant of less than 3.9 in some embodiments. In other embodiments, the upper dielectric layer 106h can comprise another dielectric material, such as silicon dioxide or a passivation material comprising a nitride or polymer material for example.

An upper metal feature 108h is disposed in the upper dielectric layer 106h and is coupled to the conductive device feature (e.g., first source/drain 302) through the lower metal feature 314 and through the intermediate metal features 109. In some embodiments, the upper metal feature 108h is a metal wire that is thicker than the lower metal feature 314 and/or is thicker than the intermediate metal features 109. For example, the upper metal feature 108h can have a thickness ranging from 500 A to 50000 A, while the lower metal feature 314 can have a thickness ranging from 100 A to 10000 A, and an intermediate metal feature 109 can have a thickness ranging from 1000 A to 150000 A. Because electrical signals tend to dissipate through more wire pathways as the signals get closer to the substrate, having the upper metal feature 108h be thicker while the intermediate metal features 109 and lower metal feature 314 are thinner provides a good balance of performance and manufacturing cost/ease.

A through substrate via (TSV) 112 extends through the semiconductor substrate 102, through the base dielectric layer 312, and through the one or more intermediate dielectric layers 106 to contact the upper metal feature 108h. The TSV 112 is made of conductive material, such as copper and/or aluminum for example. Because the TSV 112 connects to the upper metal feature 108h, which is thicker than the intermediate metal features 109, the TSV 112 provides a reduced resistance compared to other approaches. The TSV 112 has a TSV width, $w_t$, ranging from 1 micrometer to 5 micrometers, and in some embodiments, the TSV width, $w_t$, is approximately 2 micrometers. In some embodiments, vias 330 couple the upper metal feature 108h to an upper surface of the TSV 112, while in other embodiments the upper metal feature 108h has a lower surface that directly contacts the upper surface of the TSV 112 without vias 330 being present.

A protective sleeve 114 is disposed along outer sidewalls of the TSV 112 and separates the outer walls of the TSV 112 from the intermediate dielectric layers 106. The protective sleeve 114 helps to prevent damage that could otherwise occur to the intermediate dielectric layers 106 when an opening for the TSV 112 is formed during manufacturing. Thus, in FIG. 3's embodiment, the protective sleeve 114 has a lower surface that is level with an upper surface of the lower metal feature 314, and the protective sleeve 114 extends upwards to an upper surface of the TSV 112. Because the base dielectric layer 312 is made of silicon dioxide in some embodiments, which has a greater integrity than the low-k dielectric material of the intermediate dielectric layers 106, the protective sleeve 114 may have a lower surface that stops on the upper surface of the base dielectric layer 312.

In FIG. 3, the protective sleeve 114 includes a series of concentric rings that correspond to the various metal layers and via layers. Thus, a first metal ring 316 is disposed at a first height over the semiconductor substrate. The first height corresponds to a first metal line e.g., 108a, of the plurality of metal lines. A second metal ring 318 contacts an upper surface of the first metal ring 316. The second metal ring 318 is disposed at a second height over the semiconductor substrate 102 and corresponds to a first via, e.g., 110a, of the interconnect structure 104. A third metal ring 320 corresponds to a second metal layer, e.g., 108b, a fourth metal ring 322 corresponds to a second via layer, e.g., 110b, and so on. The series of concentric rings have centers that are aligned along a common axis 324 that is perpendicular to an upper surface of the substrate 102 and that corresponds to a central axis of the TSV 112.

In some embodiments, the concentric rings can have different annular thicknesses. For example, in FIG. 3, the first metal ring 316 has a first annular thickness and the second metal ring 318 has a second annular thickness that differs from the first annular thickness. Thus, an outer sidewall of the metal ring comprises a series of ridges 326 that vary over a height of the protective sleeve 114. In some embodiments, the protective sleeve 114 has an annular thickness ranging from 500 A to 140000 A.

Figure 4:
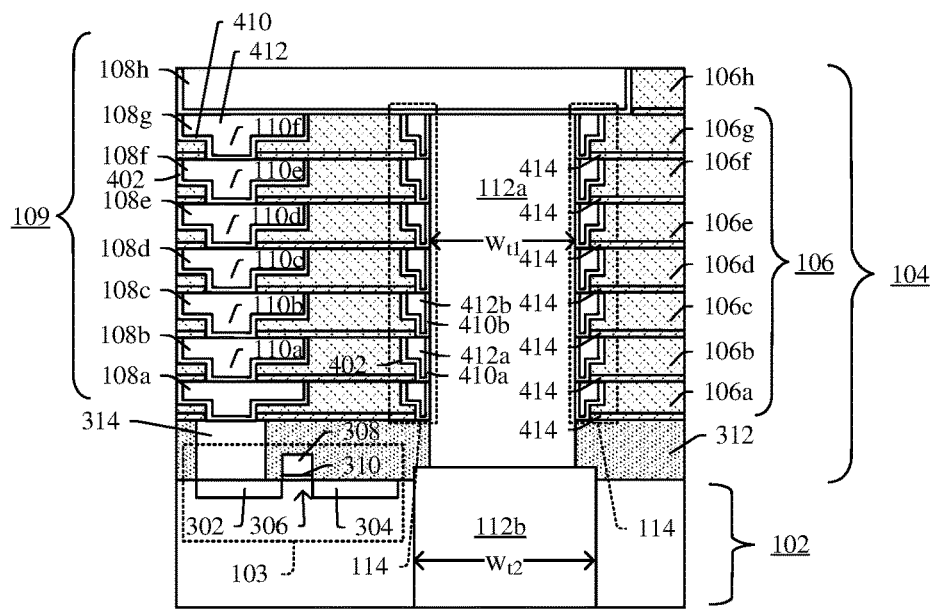
FIG. 4 illustrates a cross-sectional view of some embodiments of a semiconductor structure including TSV and a protective sleeve separating sidewalls of the TSV from adjacent dielectric layers.

Turning now to FIG. 4, one can see another semiconductor structure 400 according to some embodiments of the present disclosure. FIG. 4's semiconductor structure 400 may comprise some aspects the semiconductor structure 100 in FIGS. 1-2 and/or semiconductor structure 300 of FIG. 3 (and vice versa); and thus, in some embodiments the features explained above with regards to FIGS. 1-2 and/or FIG. 3 are also applicable to the semiconductor structure 400 in FIG. 4 (and vice versa). Accordingly, some reference numerals are the same in FIGS. 1-3 and FIG. 4 and these corresponding features may be the same for these figures or may have small deviations there between.

In contrast to FIG. 3 (in which the TSV 112 has a constant width, $w_t$, from the lowermost surface of the semiconductor substrate 102 to an upper surface of the protective sleeve 114), FIG. 4 illustrates another example where the TSV 112 exhibits a changing width over its height. In particular, the TSV in FIG. 4 has an upper TSV portion 112a having a first width, $w_{t1}$, from a location within the base dielectric layer 312 to an upper surface of the protective sleeve 114. The TSV of FIG. 4 also has a lower TSV portion 112b having a second width, $w_{t2}$, from a lowermost surface of the semiconductor substrate 102 to the location within the base dielectric layer 312. The first width $w_{t1}$ is less than the second width $w_{t2}$. For example, in some embodiments, the first width $w_{t1}$ is approximately 2 micrometers and the second width $w_{t2}$ is approximately 2.8 micrometers. In some embodiments, the base layer 314 has a thickness typically in the range of 1000 A~3000 A, and the TSV extends upward into base layer 314 around 0.01%~10% of the base layer 314. Further, a KOZ (keep-out-zone) rule used during layout/manufacturing also provides a minimum lateral spacing ranging from 0.1 um~10 um between the nearest edges of the lower TSV portion 112b and transistor 103.

In addition, FIG. 4 also shows the intermediate metal features 109 and rings of the protective sleeve 114 may each comprise a barrier layer 410 and a metal core 412. For example, the first metal ring is illustrated with a first metal ring barrier 410a and a first metal ring core 412a, the second metal ring is illustrated with a second metal ring barrier 410b and a second metal ring core 412b, and so on. The barrier layers 410 separate the metal core 412 from the adjacent dielectric layers 106, and prevent the metal of the metal core from leaching out or diffusing out and causing reliability concerns. In some embodiments, the barrier layers 410, 410a, 410b comprise tantalum, titanium, or a nitride, and the metal cores 412, 412a, 412b comprise copper and/or a copper-aluminum alloy.

FIG. 4 also illustrates etch stop layers 414 disposed within the interconnect structure 104. Each etch stop layer 414 separates adjacent dielectric layers from one another, and the vias 110a-110f extend through the etch stop layers 414 to connect vertically adjacent metal lines to one another. The etch stop layers 414 can comprise a nitride, such as silicon nitride, silicon oxynitride, or silicon carbon-nitride, in some embodiments.

FIG. 5A illustrates still another embodiment, wherein misalignment of layers and/or dielectric residue can be present in some cases due to separate lithography steps. Thus, for example, sidewalls of the first conductive ring structure 316 may be offset slightly from sidewalls of the second conductive ring structure 318 due to the fact these structures may be formed by different lithography steps. Further, in some cases, some residual dielectric material 502 may be left in place on between the outer sidewall of the TSV 112 and inner sidewall of the conductive ring structures. FIG. 5A's semiconductor structure 500 may comprise some aspects the semiconductor structure 100 in FIGS. 1-4 (and vice versa); and thus, in some embodiments the features explained above with regards to FIGS. 1-4 are also applicable to the semiconductor structure 500 in FIG. 5A (and vice versa). Accordingly, some reference numerals are the same in FIGS. 1-4 and FIG. 5A, and these corresponding features may be the same for these figures or may have small deviations there between.

FIGS. 5B-5C show other examples where multiple lower metal levels are stacked to effectively provide a thicker metal layer to which the TSV can attach. Thus, in FIG. 5B, the TSV 112 extends to the first conductive feature 108a' (e.g., metal 1 layer), in the form of a pad that is square or rectangular when viewed from overtop and which is stacked with other conductive features, such as second vias 110b', second conductive feature 108b' (e.g., metal 2 layer), and so on, to provide lower resistance coupling for lower RC values and better performance. FIG. 5C shows still another example where the vias (e.g., 110b') of FIG. 5B are wider to extend continuously under the conductive features/pads. In this approach, there is less of an area penalty if the TSV does not penetrate so far since the upper interconnect levels can still be used for interconnection. Further, frontside TSVs as well as backside TSVs are contemplated as falling within the scope of this disclosure, and thus the present disclosure is to be construed broadly in this regard.

Figure 6:
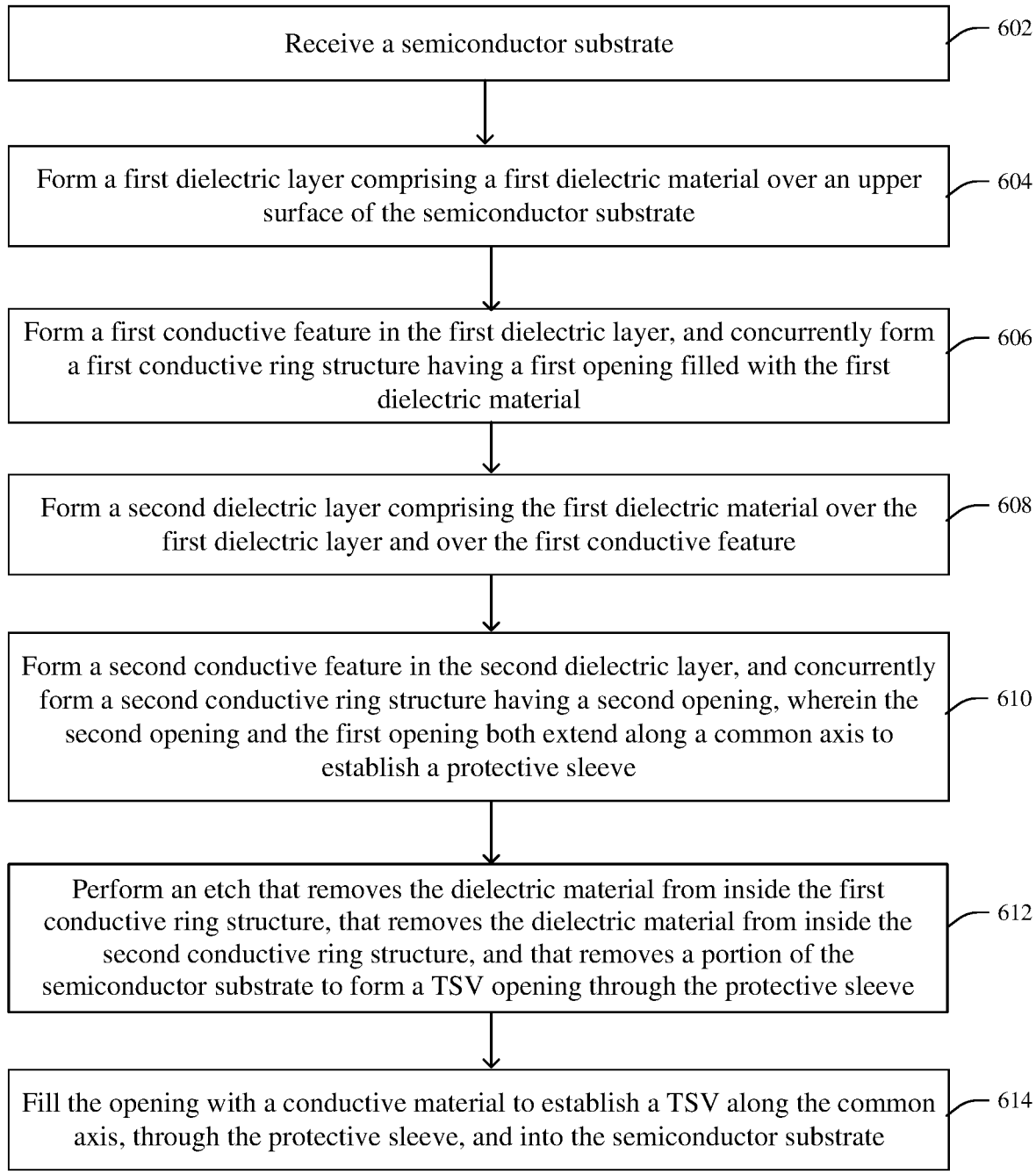
FIG. 6 illustrates a flow chart depicting some embodiments of methods in accordance with the present disclosure.

Turning now to FIG. 6, one can see a flow diagram depicting a method 600 of forming a semiconductor structure in accordance with some embodiments. It will be appreciated that the method 600 is a non-limiting example and other variations are contemplated as falling within the scope of this disclosure. While the disclosed method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Method 600 begins at act 602 when a semiconductor substrate is received.

At act 604, a first dielectric layer is formed over an upper surface of the semiconductor substrate. In some embodiments, the first dielectric layer comprises a first dielectric material that is a low-k dielectric material.

At act 606, a first conductive feature, such as a first metal line or a first via, is formed in the first dielectric layer, and a first conductive ring structure whose central opening is filled with the first dielectric layer is concurrently formed in the first dielectric layer.

At 608, a second dielectric layer is formed over the first dielectric layer and over the first conductive feature. In some embodiments, the second dielectric layer comprises a low-k dielectric material and has the same composition as the first dielectric material.

At act 610, a second conductive feature, such as a second metal line or a second via, is formed in the second dielectric layer. A second conductive ring structure is concurrently formed with the second conductive feature in the second dielectric layer. The second conductive ring feature has a second opening filled with the dielectric material, and the second opening and the first opening both extend along a common axis to establish a protective sleeve.

Though not explicitly illustrated in FIG. 6, additional dielectric layers, additional conductive features, and additional conductive rings can also be formed to extend the protective sleeve, albeit with the protective sleeve still filled with dielectric material.

At act 612, an etch is performed to remove the dielectric material from the center of the protective sleeve while leaving the dielectric material on outer sidewalls of the protective sleeve. Thus, the etch removes first dielectric material from along the common axis of the first conductive ring structure. The etch also removes the first dielectric material from along the common axis of the second conductive ring structure, and also removes a portion of the semiconductor substrate from the common axis to form a TSV opening through the protective sleeve.

At act 614, the TSV opening is filled with a conductive material to establish a TSV along the common axis, through the protective sleeve, and into the semiconductor substrate.

FIGS. 7-16 illustrate a series of cross-sectional views that collectively illustrate a manufacturing process in accordance with some embodiments.

Figure 7:
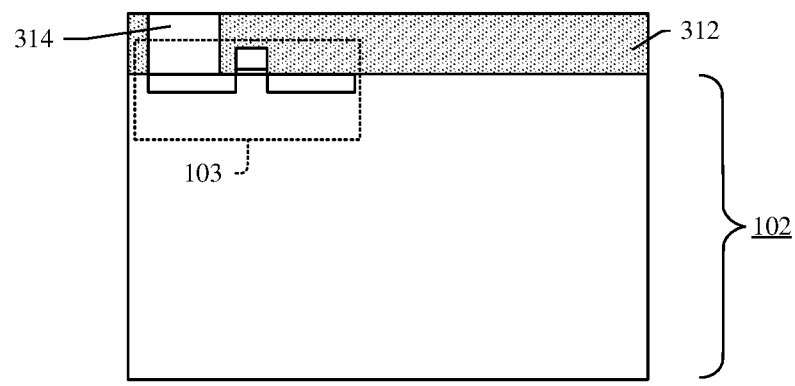
FIGS. 7-16 illustrate a series of cross-sectional views that collectively illustrate a process for manufacturing a semiconductor structure in accordance with some embodiments of the present disclosure.

FIG. 7 can correspond to some embodiments of act 602 of FIG. 6. In FIG. 7, a semiconductor substrate 102 is received, and a number of semiconductor devices, such as transistors 103, are formed in or over the semiconductor substrate 102. A base dielectric layer 312 is formed over the substrate. In some embodiments, the base dielectric layer 312 comprises silicon dioxide, although in other embodiments the base dielectric layer 312 comprises another dielectric material such as silicon nitride or a low-k dielectric for example.

Figure 8:
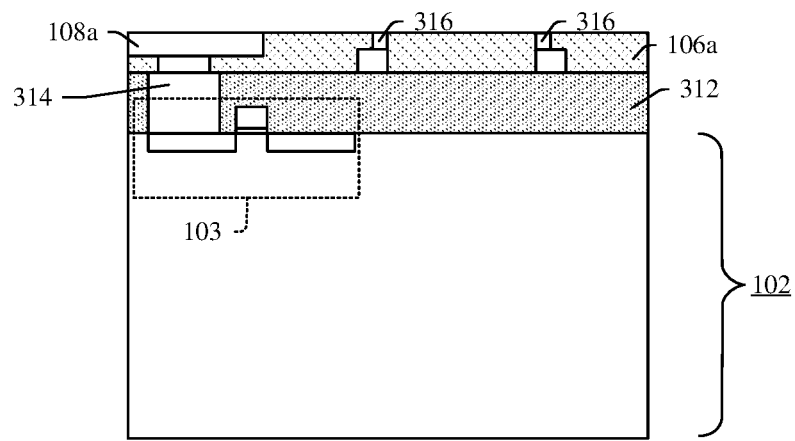

FIG. 8 can correspond to some embodiments of act 604 and act 606 of FIG. 6. In FIG. 8, a first dielectric layer 106 is formed over the semiconductor substrate 102. A first conductive feature 108a and a first conductive ring structure 316 are formed concurrently in the first dielectric layer 106a. The first conductive ring structure 316 has a first opening filled with the first dielectric material. Typically, the first conductive feature 108a and the first conductive ring structure 316 are formed by a damascene or dual damascene process. In such a process, an opening is formed in the first dielectric layer 106a by forming a mask layer (e.g., photoresist or a hard mask), and then carrying out an etch with the mask layer in place. The opening is then filled with metal, such as copper and/or aluminum, and a chemical mechanical planarization (CMP) operation is performed to provide the first conductive feature 108a and the first conductive ring structure 316.

Figure 9:
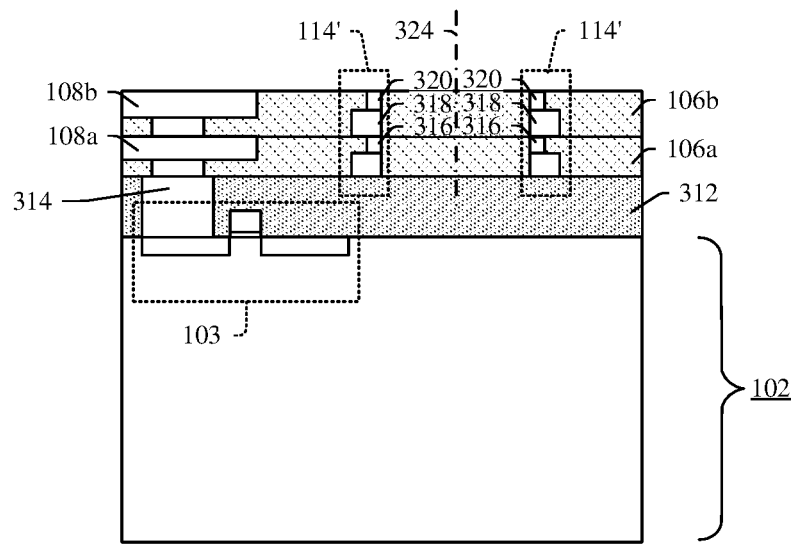

FIG. 9 can correspond to some embodiments of act 608 and act 610 of FIG. 6. In FIG. 9, a second dielectric layer 106b is formed over the first dielectric layer 106a. The second dielectric layer 106b typically comprises the same dielectric material as the first dielectric layer 106a, and for example can comprise low-k dielectric material. A second conductive feature 110a/110b and a second conductive ring structure 318/320 are formed concurrently in the second dielectric layer 106b. The second conductive ring structure 318/320 has a second central opening that is filled with the dielectric material of the second dielectric layer 106b. Typically, the second conductive feature 110a/108b and the second conductive ring structure 318/320 comprise copper and/or aluminum, and are formed by a damascene or dual damascene process. To form these structures, an opening is formed in the second dielectric layer 106b by forming a mask layer (e.g., photoresist or a hard mask), and then carrying out an etch with the mask layer in place. The opening is then filled with metal, such as copper and/or aluminum, and a chemical mechanical planarization (CMP) operation is performed to provide the second conductive feature 110a/108b and the second conductive ring structure 318/320. A common axis 324 extends through centers of the first conductive ring structure 316 and second conductive ring structure 318/320 to establish a protective sleeve 114'.

Figure 10:
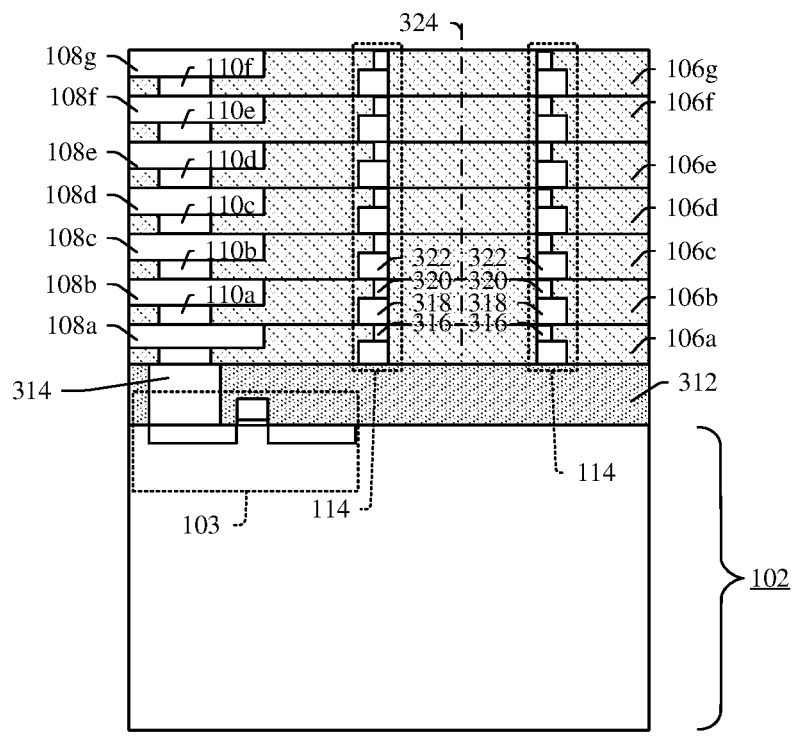

In FIG. 10, additional dielectric layers (e.g., 106c-106g) are formed, and additional conductive features including metal lines, vias, and conductive ring structures are concurrently formed in each additional dielectric layer. These additional conductive features can be formed, for example by using a damascene process, and can elongate the protective sleeve 114. The additional conductive ring segments have respective centers that are aligned along the common axis 324 that is perpendicular to the upper surface of the substrate 102.

Figure 11:
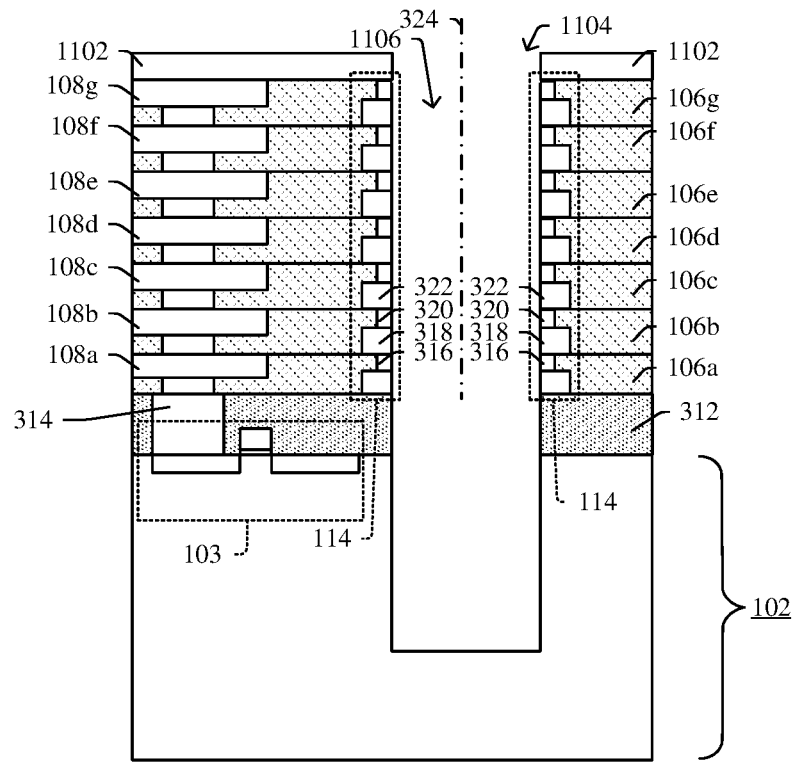

FIG. 11 can correspond to some embodiments of act 612 of FIG. 6. In FIG. 11, a mask 1102 such as a photoresist mask and/or hardmask is formed on the upper surface of the top dielectric layer 106g. The mask 1102 includes an opening 1104 that exposes an upper surface of the dielectric material in the protective sleeve 114. Then, with the mask 1102 in place, an etch is performed to remove the dielectric material from along the common axis 324 of the protective sleeve 114, and to remove a portion of the semiconductor substrate along the common axis 324, thereby forming a TSV opening 1106 through the protective sleeve 114 and extending into the substrate 102. During the etch, the protective sleeve 114 protects the dielectric layers 106a-106g from damage that could otherwise occur from the etch. The etch can be a dry etch, such as a plasma etch or reactive ion etch, or can be a wet etch.

Figure 12:
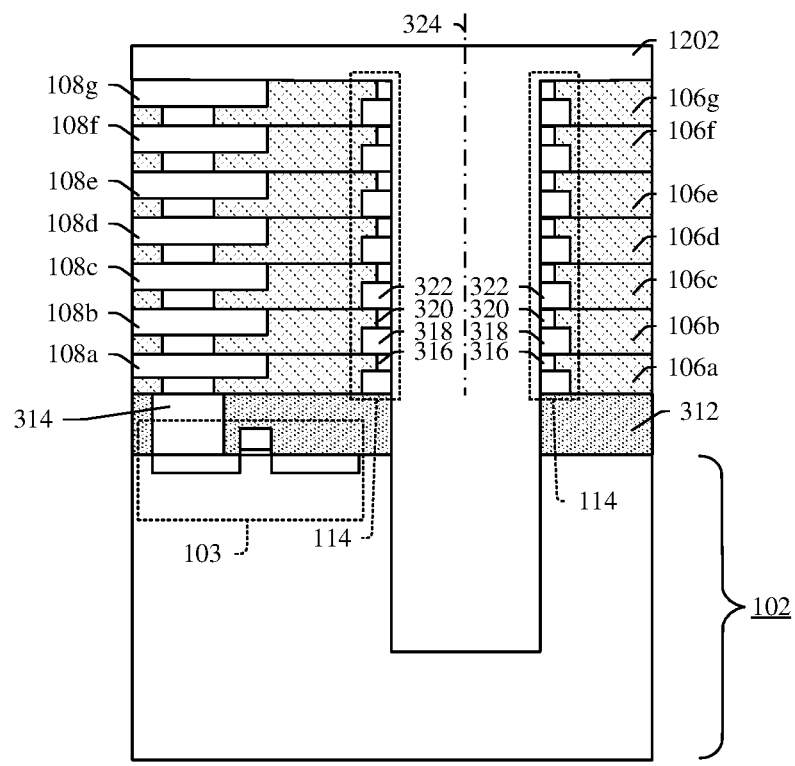

FIG. 12 can correspond to some embodiments of act 614 of FIG. 6. In FIG. 12, a metal layer 1202 is formed to fill the TSV opening. The metal layer 1202 can comprise copper and/or aluminum in some embodiments. In some embodiments, the metal layer 1202 can be formed by physical vapor deposition (PVD), chemical vapor deposition (CVD), sputtering, electroplating, or electro-less plating, for example.

Figure 13:
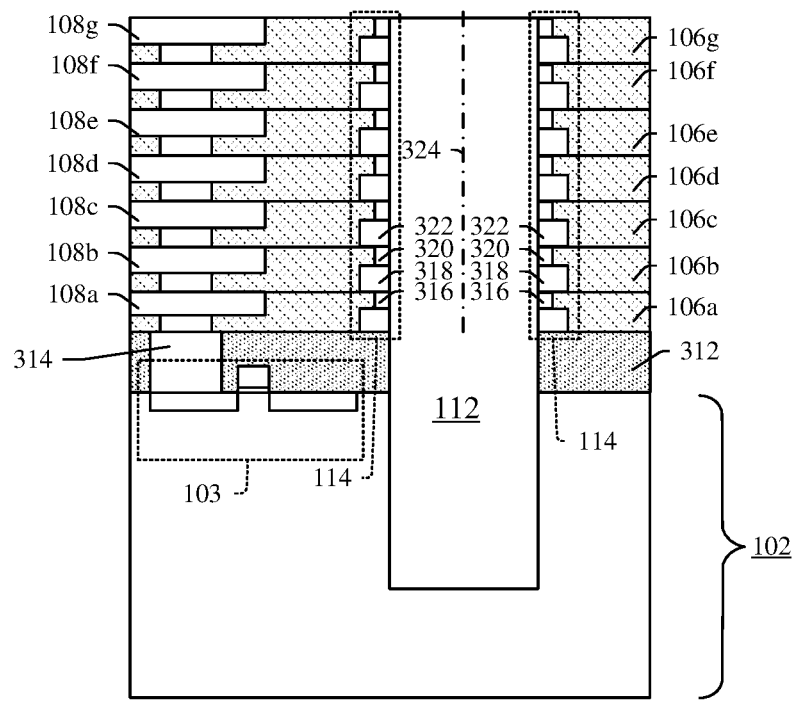

In FIG. 13, chemical mechanical planarization (CMP) is performed to remove an uppermost portion of the metal layer, thereby planarizing the top surface of the metal layer and fashioning a TSV 112 that is bounded by the protective sleeve 114.

Figure 14:
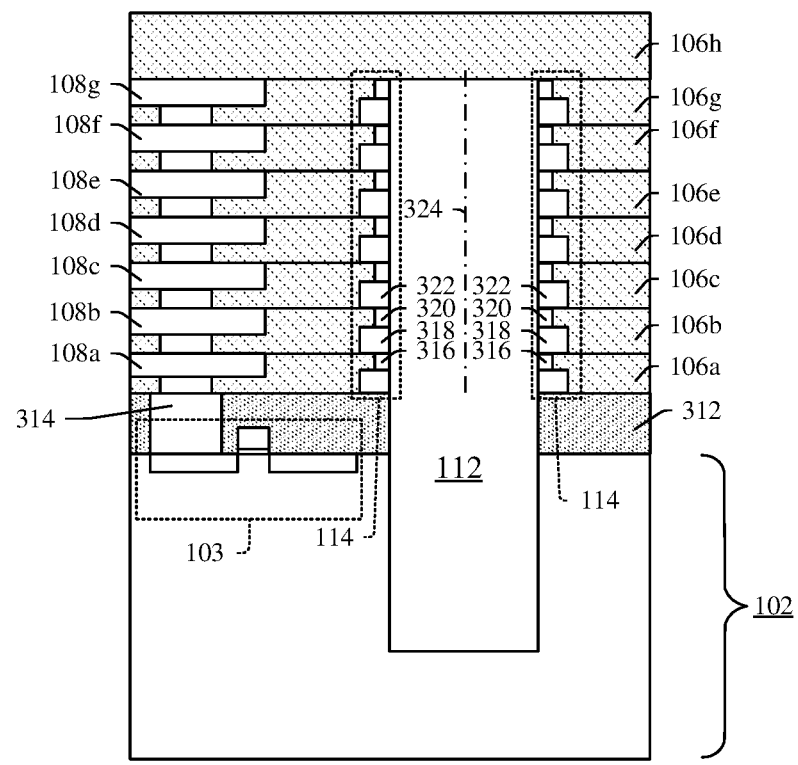

In FIG. 14, an uppermost dielectric layer 106h is formed over the TSV 112. The uppermost dielectric layer 106h can comprise silicon dioxide, a low-k dielectric, a nitride layer, such as silicon nitride, silicon oxynitride, or silicon carbonnitride, for example.

Figure 15:
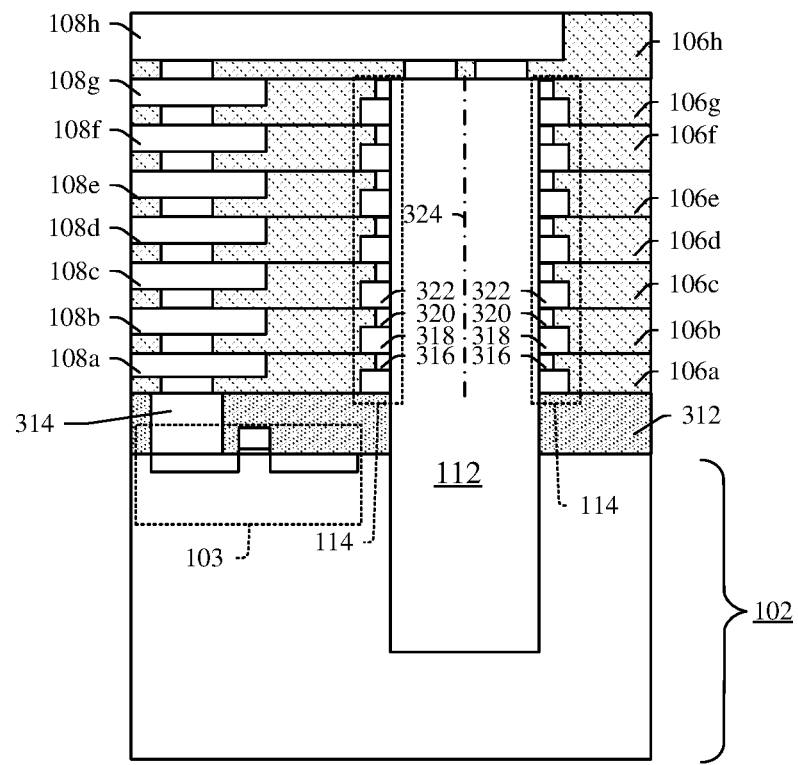

In FIG. 15, an upper metal layer 108h is formed. In some embodiments the upper metal layer 108h and underlying vias can be formed by a single damascene process or a dual-damascene process wherein an opening is formed in the uppermost dielectric layer 106h, and metal such as copper and/or aluminum is formed in the opening to form the upper metal layer 108h and underlying vias.

Figure 16:
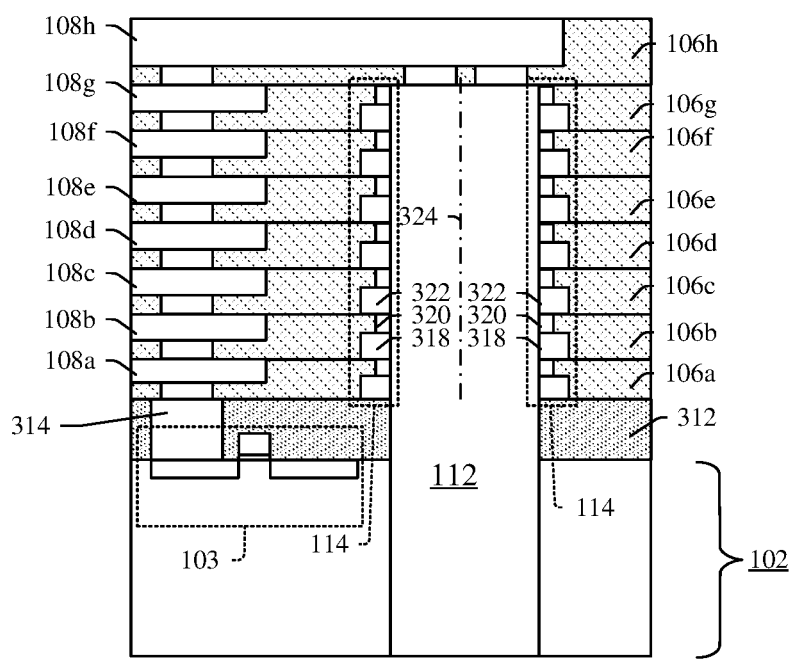

In FIG. 16, a backside of the semiconductor substrate is thinned, for example by a grinding operation and/or a CMP operation to expose a bottom surface of the TSV 112.

FIGS. 17-23 illustrate a series of cross-sectional views that collectively illustrate another manufacturing process in accordance with some embodiments.

Figure 17:
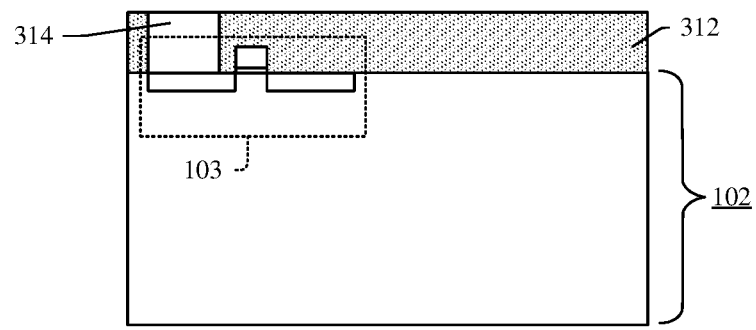
FIGS. 17-23 illustrate a series of cross-sectional views that collectively illustrate a process for manufacturing a semiconductor structure in accordance with other embodiments of the present disclosure.

FIG. 17 can correspond to some embodiments of act 602 of FIG. 6. In FIG. 17, a first semiconductor substrate 102 is received, and a number of semiconductor devices, such as transistors 103, are formed in or over the first semiconductor substrate 102. A base dielectric layer 312 is formed over the first semiconductor substrate 102. In some embodiments, the base dielectric layer 312 comprises silicon dioxide, although in other embodiments the base dielectric layer 312 comprises another dielectric material such as silicon nitride or a low-k dielectric for example.

Figure 18:
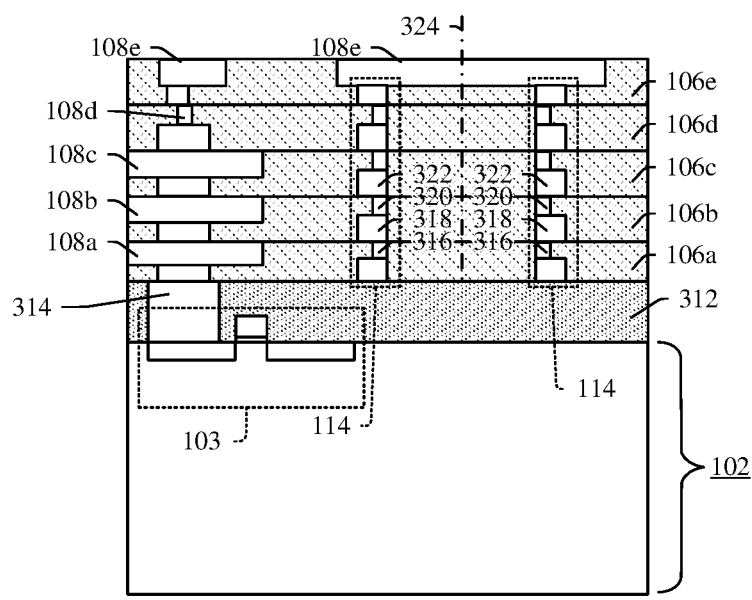

FIG. 18 can correspond to some embodiments of act 604, act 606, act 608, and act 610 of FIG. 6. In FIG. 18, a first dielectric layer 106a is formed over the first semiconductor substrate 102. A first conductive feature 108a and a first conductive ring structure 316 are formed concurrently in the first dielectric layer 106a. The first conductive ring structure 316 has a first central opening filled with the first dielectric material. Typically, the first conductive feature 108a and the first conductive ring structure 316 are formed by a damascene or dual damascene process. In such a process, an opening is formed in the first dielectric layer 106a by forming a mask layer (e.g., photoresist or a hard mask), and then carrying out an etch with the mask layer in place. The opening is then filled with metal, such as copper and/or aluminum, and a chemical mechanical planarization (CMP) operation is performed to provide the first conductive feature 108a and the first conductive ring structure 316.

Further in FIG. 18, a second dielectric layer 106b is formed over the first dielectric layer 106a. The second dielectric layer 106b typically comprises the same dielectric material as the first dielectric layer 106a, and for example can comprise low-k dielectric material. A second conductive feature 110a/108b and a second conductive ring structure 318/320 are formed concurrently in the second dielectric layer 106b. The second conductive ring structure 318/320 has a second central opening and is filled with the dielectric material of the second dielectric layer 106b. Typically, the second conductive feature 110a/108b and the second conductive ring structure 318/320 comprise copper and/or aluminum, and are formed by a damascene or dual damascene process. Thus, an opening is formed in the second dielectric layer 106b by forming a mask layer (e.g., photoresist or a hard mask), and then carrying out an etch with the mask layer in place. The opening is then filled with metal, such as copper and/or aluminum, and a chemical mechanical planarization (CMP) operation is performed to provide the second conductive feature 110a/108b and the second conductive ring structure 318/320. A common axis 324 extends through centers of the first conductive ring structure 316 and second conductive ring structure 318/320.

Further still in FIG. 18, additional dielectric layers are formed, and additional conductive features including metal lines, vias, and conductive ring structures are concurrently formed in each additional dielectric layer. These additional conductive features can be formed, for example by using a damascene process, and establish a protective sleeve 114. The additional conductive ring segments have respective centers that are aligned along the common axis 324 that is perpendicular to the upper surface of the first substrate 102. An uppermost dielectric layer 106e and an uppermost metal layer 108e define an uppermost surface of the first semiconductor structure of FIG. 18.

Figure 19:
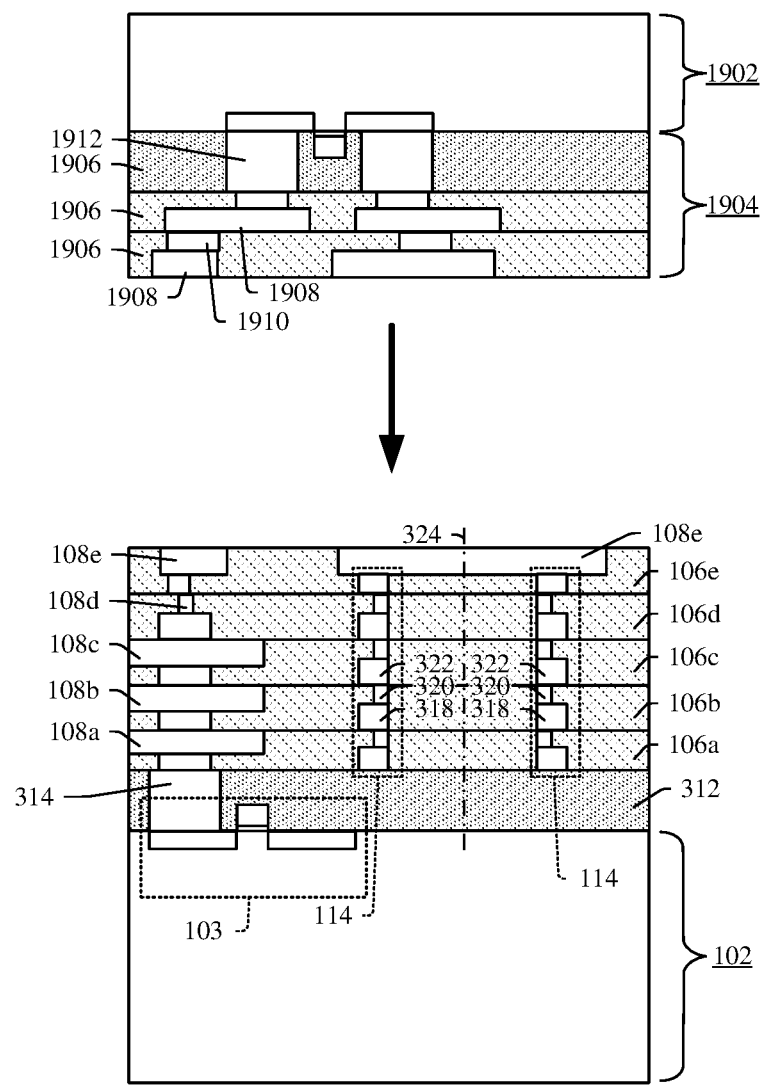

In FIG. 19, a second semiconductor structure is bonded to the uppermost surface of the semiconductor structure of FIG. 18. The second semiconductor structure can be bonded to the first semiconductor structure through a fusion bonding process, a hybrid bonding process, or some other bonding process. The second semiconductor structure includes a second semiconductor substrate 1902, such as a monocrystalline semiconductor substrate or an SOI substrate for example. Semiconductor devices, such an active device in the form of a FinFET, MOSFET, or BJT for example; and/or a passive device such as a diode, resistor, capacitor, and/or memory element; are disposed in the second semiconductor substrate 1902. A second interconnect structure 1904 is disposed on or over the second semiconductor substrate 1902. The second interconnect structure 1904 includes a dielectric structure 1906 made up of a plurality of dielectric layers, and a plurality of metal wiring layers 1908, metal via layers 1910, and contacts 1912 that extend through the dielectric structure to couple the semiconductor devices in the second semiconductor substrate 1902 to one another.

Figure 20:
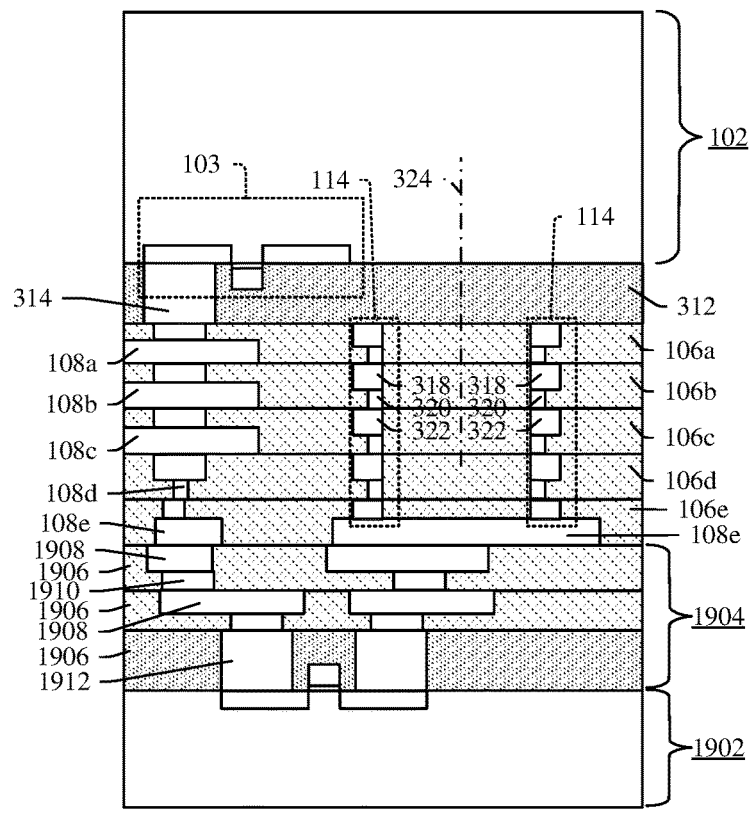

FIG. 20 depicts an the structures of FIG. 19 after the first semiconductor structure has been bonded to the second semiconductor structure, and the structures have been flipped vertically.

Figure 21:
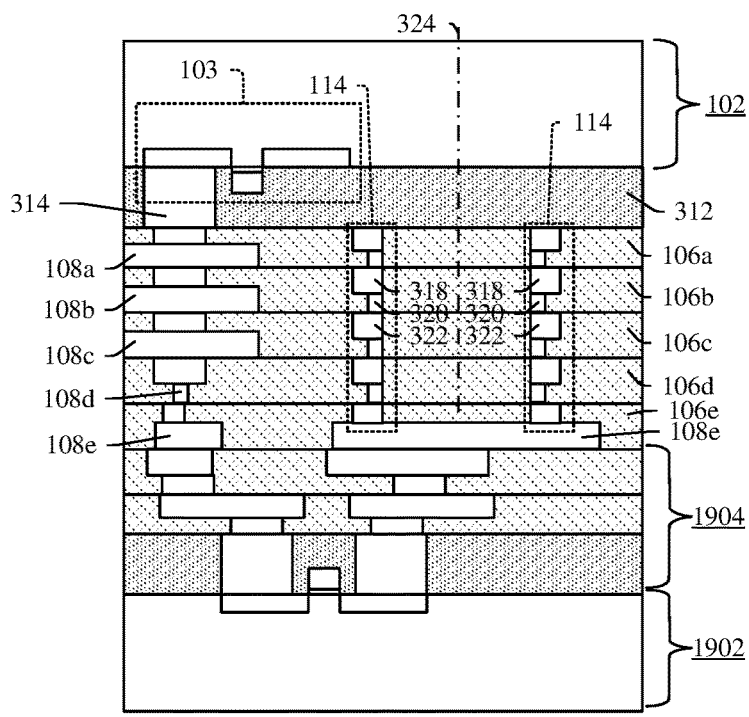

In FIG. 21, the first semiconductor substrate 102 is thinned. This thinning is typically accomplished by a grinding operation or a CMP operation, but could also be achieved by some other etching process, such as a dry etch or a wet etch.

Figure 22:
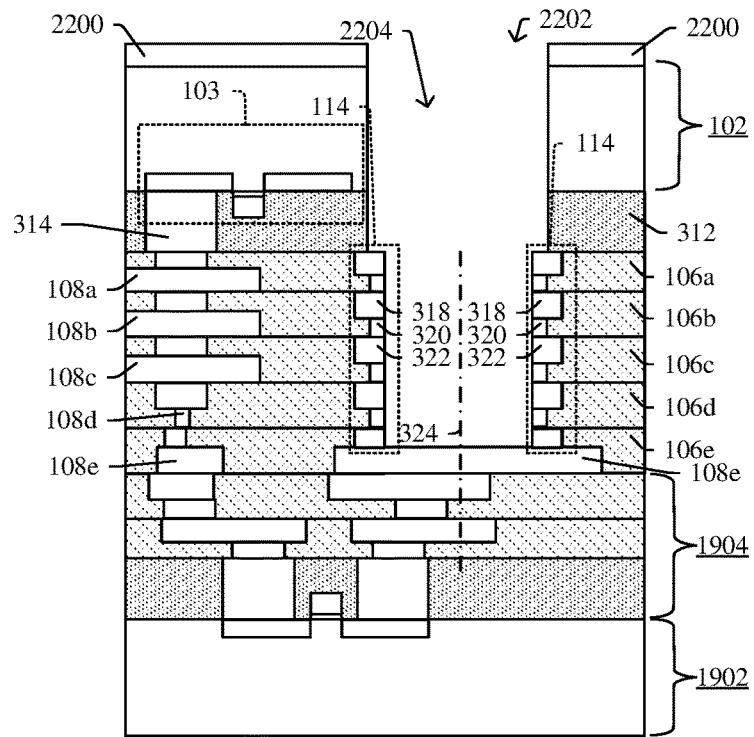
Figure 23:
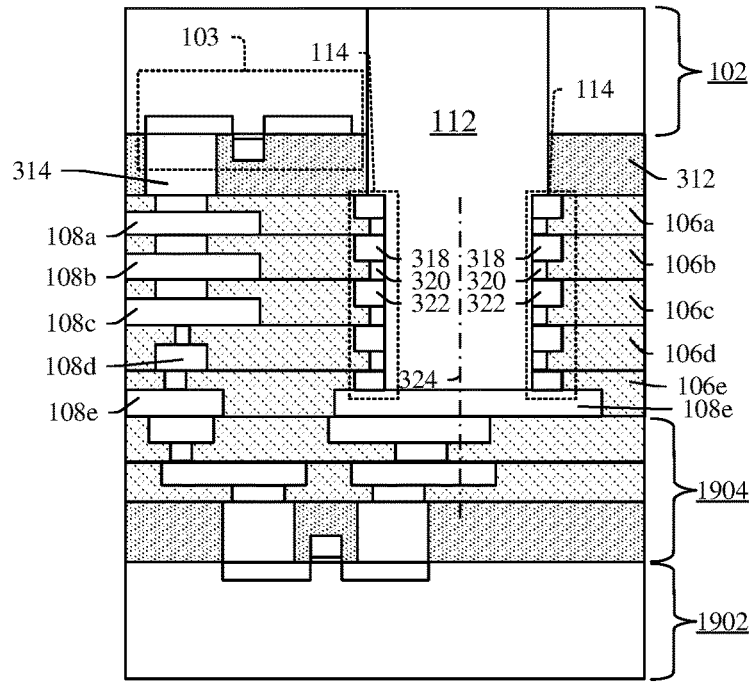

In FIG. 22, a mask 2200 such as a photoresist mask and/or hardmask is formed on the backside of the first semiconductor substrate 102. The mask 2200 includes an opening 2202 that exposes the backside of the first semiconductor substrate 102 and that is aligned over the protective sleeve 114. Then, with the mask 2200 in place, an etch is performed to remove a portion of the first semiconductor substrate 102 along the common axis 324, and to remove the dielectric material from inside the protective sleeve 114, thereby forming a TSV opening 2204 through the protective sleeve 114. The etch stops on the upper metal layer 108e in some embodiments. During the etch, the protective sleeve 114 protects the dielectric layers 106a-106g from damage that could otherwise occur from the etch. The etch can be a dry etch, such as a plasma etch or reactive ion etch, or can be a wet etch.

In FIG. 22, a metal layer is formed to fill the TSV opening, and chemical mechanical planarization (CMP) is performed to remove an uppermost portion of the metal layer, thereby planarizing the top surface of the metal and fashioning a TSV 112 that is bounded by the protective sleeve 114. The metal layer can comprise copper and/or aluminum in some embodiments. In some embodiments, the metal layer can be formed by physical vapor deposition (PVD), chemical vapor deposition (CVD), sputtering, electroplating, or electro-less plating, for example.

Thus, some embodiments of the present disclosure relate to a semiconductor structure including a semiconductor substrate, and n interconnect structure disposed over the semiconductor substrate. The interconnect structure includes a dielectric structure and a plurality of metal lines that are stacked over one another in the dielectric structure. A through substrate via (TSV) extends through the semiconductor substrate to contact a metal line of the plurality of metal lines. A protective sleeve is disposed along outer sidewalls of the TSV and separates the outer sidewalls of the TSV from the dielectric structure of the interconnect structure.

Other embodiments relate to a method. In the method, a semiconductor substrate is received. A first dielectric layer comprising a first dielectric material is formed over an upper surface of the semiconductor substrate. A first conductive feature is formed in the first dielectric layer, and a first conductive ring structure having a first opening filled with the first dielectric material is formed concurrently. A second dielectric layer is then formed over the first dielectric layer and over the first conductive feature. The second dielectric layer comprises the first dielectric material. A second conductive feature is formed in the second dielectric layer, and a second conductive ring structure having a second opening filled with the first dielectric material is concurrently formed. The first conductive ring structure and the second conductive ring structure both extend along a common axis to establish a protective sleeve. An etch is performed to removes the first dielectric material from along the common axis of the first conductive ring structure, to remove the first dielectric material from along the common axis of the second conductive ring structure, and to remove a portion of the semiconductor substrate along the common axis to form an opening through the protective sleeve and into the semiconductor substrate. The opening is filled with a conductive material to establish a through substrate via (TSV) along the common axis and through the protective sleeve and into the semiconductor substrate.

Still other embodiments relate to a semiconductor structure. The semiconductor structure includes semiconductor substrate including a conductive device feature. A base dielectric layer is disposed over the semiconductor substrate. The base dielectric layer has a first dielectric constant. A lower metal feature is disposed in the base dielectric layer and contacts the conductive device feature. An intermediate dielectric layer is disposed over the base dielectric layer, and has a second dielectric constant that is less than the first dielectric constant. An intermediate metal feature is disposed in the intermediate dielectric layer and is coupled to the lower metal feature. An upper dielectric layer is disposed over the intermediate dielectric layer, and has the second dielectric constant. An upper metal feature is disposed in the upper dielectric layer and is coupled to the conductive device feature through the lower metal feature and through the intermediate metal feature. A through substrate via (TSV) extends through the semiconductor substrate, through the base dielectric layer, and through the intermediate dielectric layer to contact the upper metal feature. A protective metal sleeve is disposed along outer sidewalls of the TSV and separates the outer sidewalls of the TSV from the intermediate dielectric layer. The protective metal sleeve has a lower surface that is level with an upper surface of the lower metal feature and extends upwards to an upper surface of the TSV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a semiconductor substrate;
forming a first dielectric layer comprising a first dielectric material over an upper surface of the semiconductor substrate;
forming a first conductive feature in the first dielectric layer, and concurrently forming a first conductive ring structure having a first outer perimeter and a first inner perimeter filled with the first dielectric material as viewed from above, wherein at least one of the first outer perimeter or the first inner perimeter comprises a linear edge as viewed from above;
forming a second dielectric layer comprising the first dielectric material over the first dielectric layer and over the first conductive feature;
forming a second conductive feature in the second dielectric layer, and concurrently forming a second conductive ring structure having a second outer perimeter and a second inner perimeter filled with the first dielectric material, wherein the first conductive ring structure and the second conductive ring structure both extend along a common axis to establish a protective sleeve comprising a linear edge as viewed from above;
performing an etch that starts by removing a portion of the second dielectric layer, then continues by removing a portion of the first dielectric material, before removing a portion of the semiconductor substrate to form an opening into the semiconductor substrate and through the protective sleeve; and
filling the opening with a conductive material to establish a through substrate via (TSV) along the common axis;
wherein the TSV is defined between a bottom surface of the TSV and a top surface of the TSV, the bottom surface having a first width and the top surface having a second width that is equal to the first width; and
wherein when viewed in a cross-sectional view, the etch leaves a residual portion of the first dielectric material along a first sidewall of the first inner perimeter of the first conductive ring, wherein after the opening is filled with the conductive material, the residual portion separates the first sidewall of the first inner perimeter of the first conductive ring from the conductive material while a second sidewall of the first inner perimeter of the first conductive ring contacts the conductive material.

2. The method of claim 1, further comprising:
forming a base dielectric layer over the semiconductor substrate prior to formation of the first dielectric layer; and
forming a contact through the base dielectric layer, wherein the contact couples the first conductive feature to a conductive device feature in the semiconductor substrate.

3. The method of claim 2, wherein the protective sleeve laterally surrounds the TSV and extends continuously from the upper surface of the base dielectric layer to the upper surface of the second dielectric layer.

4. The method of claim 3, wherein a lowermost surface of the protective sleeve is spaced apart from the upper surface of the semiconductor substrate by the base dielectric layer.

5. The method of claim 1, wherein the first conductive feature corresponds to a metal1 line, and the second conductive feature corresponds to a metal2 line.

6. The method of claim 1, further comprising:
forming a first conductive via feature disposed between the first conductive feature and the second conductive feature and concurrently forming a first conductive via ring structure between the first conductive ring structure and the second conductive ring structure, the first conductive via ring structure having a central opening that extends along the common axis.

7. The method of claim 1, wherein the first conductive ring structure has a first annular thickness and the second conductive ring structure has a second annular thickness greater than the first annular thickness.

8. A method of forming a semiconductor structure, comprising:

receiving a semiconductor substrate;
forming an interconnect structure over the semiconductor substrate, the interconnect structure comprising a dielectric structure, wherein a plurality of metal lines are stacked over one another in the dielectric structure and a protective sleeve includes a lower rectangular ring structure and an upper rectangular ring structure arranged within the dielectric structure, wherein the lower rectangular ring structure is disposed at a first height over a face of the semiconductor substrate and the upper rectangular ring structure is disposed at a second height over the face of the semiconductor substrate, the second height being greater than the first height and the lower rectangular ring structure having a first inner perimeter that is axially offset from a second inner perimeter of the upper rectangular ring structure by a distance;
performing an etch to remove a portion of the dielectric structure from within the first and second inner perimeters to form an opening extending through the protective sleeve and extending partially into but not entirely through the semiconductor substrate, wherein the etch leaves a residual portion of the dielectric structure having a lateral thickness equal to the distance along a sidewall of the first inner perimeter of the lower rectangular ring structure; and
forming a through substrate via (TSV) that fills the opening and contacts the residual portion of the dielectric structure, the TSV extending through the protective sleeve to contact a metal line of the plurality of metal lines but not extending entirely though the semiconductor substrate.

9. The method of claim 8, wherein the plurality of metal lines include a metal1 line corresponding to the first height and a metal3 line corresponding to the second height, and the protective sleeve has an inner sidewall that directly contacts outer sidewalls of the TSV from the metal1 line to the metal3 line.

10. The method of claim 8, wherein at least one lower metal line is disposed between a metal line and an upper surface of the semiconductor substrate, and the metal line corresponds to a top surface of the TSV furthest from the upper surface of the semiconductor substrate.

11. The method of claim 10, wherein the protective sleeve comprises the same metal as the metal line.

12. The method of claim 8, wherein the protective sleeve comprises:
an outer sidewall of the protective sleeve comprises a series of ridges that vary over a height of the protective sleeve.

13. The method of claim 8, wherein the protective sleeve extends along a common axis that is perpendicular to an upper surface of the semiconductor substrate, and the protective sleeve has different annular thicknesses at different respective locations of the common axis.

14. The method of claim 8, wherein the TSV exhibits a constant width from a lowermost surface of the semiconductor substrate to an upper surface of the protective sleeve.

15. The method of claim 8, wherein the TSV exhibits a first width between a lowermost surface of the semiconductor substrate and an uppermost surface of the semiconductor substrate, and has a second width, which is less than the first width, between the uppermost surface of the semiconductor substrate and an upper surface of the protective sleeve.

16. A method comprising:
receiving a semiconductor substrate including a conductive device feature;
forming a base dielectric layer disposed over the semiconductor substrate, the base dielectric layer having a first dielectric constant;
forming a lower metal feature in the base dielectric layer, the lower metal feature contacting the conductive device feature;
forming an intermediate dielectric layer over the base dielectric layer, the intermediate dielectric layer having a second dielectric constant that is less than the first dielectric constant;
forming an intermediate metal feature and an intermediate metal sleeve feature in the intermediate dielectric layer, the intermediate metal sleeve feature having inner sidewalls spaced apart by a first distance;
forming an upper dielectric layer over the intermediate dielectric layer, the upper dielectric layer having the second dielectric constant;
forming an upper metal feature and an upper metal sleeve feature in the upper dielectric layer, the upper metal feature coupled to the conductive device feature through the lower metal feature and through the intermediate metal feature, and the upper metal sleeve feature axially offset from the intermediate metal sleeve feature by a lateral distance;
forming a continuous opening extending axially though interior portions of the intermediate metal sleeve feature and the upper metal sleeve feature while leaving a residual portion of the intermediate dielectric layer having a lateral thickness equal to the lateral distance along an inner sidewall of the intermediate metal sleeve feature, wherein a portion of the continuous opening in the semiconductor substrate has sidewalls that are spaced apart by the first distance; and
forming a through substrate via (TSV) filling the continuous opening, the TSV extending through the semiconductor substrate to contact the lower metal feature.

17. The method of claim 16, wherein the intermediate metal sleeve feature and the upper metal sleeve feature comprise the same metal as the intermediate metal feature.

18. The method of claim 17, wherein the intermediate metal sleeve feature comprises:
a first metal ring disposed at a first height over the semiconductor substrate, the first height corresponding to a first metal line of the intermediate metal feature.

19. The method of claim 16, wherein the TSV is defined between a bottom surface of the TSV and a top surface of the TSV, the bottom surface having a first width and the top surface having a second width that is equal to the first width.

20. The method of claim 16, wherein an inner sidewall of the upper metal sleeve feature is spaced apart from the TSV by the residual portion of the intermediate dielectric layer and wherein a second inner sidewall of the upper metal sleeve feature, which is opposite the inner sidewall, directly contacts the TSV.

* * * * *